US010694637B1

(12) United States Patent
Wolf et al.

(10) Patent No.: US 10,694,637 B1
(45) Date of Patent: Jun. 23, 2020

(54) MODULAR ANTENNA ARRAY SYSTEM WITH THERMAL MANAGEMENT

(71) Applicant: Rockwell Collins, Inc., Cedar Rapids, IA (US)

(72) Inventors: Jeremiah D. Wolf, Atkins, IA (US); Scott J. Sellner, Lisbon, IA (US); James B. West, Cedar Rapids, IA (US); Eric D. Baldwin, Amana, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 16/137,051

(22) Filed: Sep. 20, 2018

(51) Int. Cl.
*H05K 7/20* (2006.01)
*H01Q 21/06* (2006.01)
*H01Q 1/28* (2006.01)
*H01Q 1/24* (2006.01)
*H01Q 1/42* (2006.01)
*H01Q 21/00* (2006.01)

(52) U.S. Cl.
CPC .......... *H05K 7/20163* (2013.01); *H01Q 1/24* (2013.01); *H01Q 1/28* (2013.01); *H01Q 1/42* (2013.01); *H01Q 21/0025* (2013.01); *H01Q 21/061* (2013.01); *H05K 7/20409* (2013.01)

(58) Field of Classification Search
CPC ..... H05K 7/1401–1402; H05K 7/1409; H05K 7/1411; H05K 7/1418; H05K 7/1424; H05K 7/1429; H05K 7/20145; H05K 7/1452; H05K 7/1438; H05K 7/1459; H05K 7/1461; H05K 7/20163–20418; H05K 7/20409; H05K 7/20445; H05K 7/20545; H05K 7/20854; H05K 8/0041; H05K 3/403; H01Q 1/24; H01Q 1/28; H01Q 1/42; H01Q 21/24; H01Q 21/0025; H01Q 21/061; H01Q 14/148; H04B 1/38
USPC ............ 361/702, 679.54, 707, 709–710, 800
See application file for complete search history.

(56) References Cited

U.S. PATENT DOCUMENTS

| 3,470,421 | A | * | 9/1969 | Shore | ................. | H01R 12/7088 |
| | | | | | | 361/826 |
| 4,511,950 | A | * | 4/1985 | Bunner | ................ | H05K 1/0263 |
| | | | | | | 361/788 |
| 4,858,070 | A | * | 8/1989 | Buron | ................... | B22C 1/2253 |
| | | | | | | 361/695 |
| 6,469,671 | B1 | * | 10/2002 | Pluymers | ................ | G01S 7/032 |
| | | | | | | 343/700 MS |

(Continued)

*Primary Examiner* — Jayprakash N Gandhi
*Assistant Examiner* — Amir A Jalali
(74) *Attorney, Agent, or Firm* — Donna P. Suchy

(57) ABSTRACT

An antenna assembly includes a plurality of RF card assemblies, a backplane circuit board, a plurality of connectors, and a chassis. Each of the RF card assemblies includes a circuit board having a number of antenna elements. The backplane circuit board includes a top surface with at least one set of power supply rails. The connectors are arranged in rows along a top surface of the backplane circuit board. Each of the connectors has an inlet configured to receive one of the RF card assemblies along a plane perpendicular to the top surface of the backplane circuit board. The bottom surface includes power supply pins configured to engage the power supply rails. The chassis is configured to enclose the backplane circuit board, the RF card assemblies, and the connectors.

20 Claims, 6 Drawing Sheets

(56) References Cited

U.S. PATENT DOCUMENTS

| | | | |
|---|---|---|---|
| 8,559,183 B1* | 10/2013 | Davis | H05K 7/1412 |
| | | | 361/760 |
| 2003/0080915 A1* | 5/2003 | Ngin | B32B 7/02 |
| | | | 343/789 |
| 2008/0062038 A1* | 3/2008 | Ouchi | G01S 7/032 |
| | | | 342/175 |
| 2008/0252552 A1* | 10/2008 | Goebel | H01Q 1/246 |
| | | | 343/872 |
| 2009/0142970 A1* | 6/2009 | Patel | H01R 13/514 |
| | | | 439/712 |
| 2009/0212164 A1* | 8/2009 | Osborne | B64C 23/005 |
| | | | 244/205 |
| 2013/0021203 A1* | 1/2013 | Gritz | H01Q 19/062 |
| | | | 342/368 |
| 2013/0109201 A1* | 5/2013 | Wu | H01R 12/7005 |
| | | | 439/59 |
| 2013/0183913 A1* | 7/2013 | Tevell | H01Q 1/1207 |
| | | | 455/90.3 |
| 2015/0230365 A1* | 8/2015 | Kaplun | B23P 15/26 |
| | | | 361/689 |
| 2017/0040679 A1* | 2/2017 | Frohler | H01Q 1/246 |
| 2019/0116676 A1* | 4/2019 | Hu | H05K 3/38 |

* cited by examiner

MODULAR ANTENNA ARRAY SYSTEM WITH THERMAL MANAGEMENT

BACKGROUND

The inventive concepts disclosed herein relate generally to the field of antenna systems. More particularly, embodiments of the inventive concepts disclosed herein relate generally to the field of antenna arrays including but not limited to, phased array antenna systems or electronically scanned array (ESA) antenna systems, such as an active electronically scanned array (AESA) antenna systems.

Antenna arrays are utilized with transceivers. As used in this application, the term transceiver refers to an electronic device embodied as a transmitter, a receiver or a transmitter/receiver. The antenna array can be electronically steered by using variable phase shifters or time delay units coupled to respective antenna elements in the antenna array to direct the antenna at a pointing angle. The antenna array is coupled to the transceiver through an interface that includes the phase shifters or time delay units as well as components, such as, apertures, power amplifiers, low noise amplifiers, transmit/receive switches, temperature sensing equipment, combiners, connectors, printed circuit board (PCB), printed wiring board (PWB), etc.

Antenna systems may exhibit thermal management challenges. Further, antenna systems may become damaged, for example due to poor thermal conduction paths and other thermal management issues. Furthermore, antenna systems may suffer from subassembly testing, troubleshooting, and field service challenges because, for example, it can be difficult to isolate and connect to subarrays and other components without causing damage.

SUMMARY

In one aspect, the inventive concepts disclosed herein are directed to an antenna assembly. The antenna assembly includes a plurality of RF card assemblies, a backplane circuit board, a plurality of connectors, and a chassis. Each of the RF card assemblies includes a circuit board having a number of antenna elements. The backplane circuit board includes a top surface with at least one set of power supply rails, where each set of power supply rails includes an electric power rail and a ground path rail. The electric power rail includes connections configured to supply electric power to the RF card assemblies, and the ground path rail includes connections configured to provide a ground path to the RF card assemblies. The connectors are arranged in rows along a top surface of the backplane circuit board. Each of the connectors has a bottom surface configured to engage a top surface of the backplane circuit board. Each of the connectors has an inlet configured to receive one of the RF card assemblies along a plane perpendicular to the top surface of the backplane circuit board. The bottom surface includes a plurality of power supply pins configured to engage the electric power rail and the ground path rail. The chassis is configured to enclose the backplane circuit board, the RF card assemblies, and the connectors.

In a further aspect, the inventive concepts disclosed herein are directed to a system. The system includes a platform and an antenna assembly. The antenna assembly includes a plurality of RF card assemblies, a backplane circuit board, connectors, and a chassis. Each of the RF card assemblies includes a circuit board having a number of antenna elements. The backplane circuit board includes a top surface with at least one set of power supply rails, where each set of power supply rails includes an electric power rail and a ground path rail. The electric power rail includes connections configured to supply electric power to the RF card assemblies, and the ground path rail includes connections configured to provide a ground path to the RF card assemblies. The connectors are arranged in rows along a top surface of the backplane circuit board. Each of the connectors has a bottom surface configured to engage a top surface of the backplane circuit board. Each of the connectors has an inlet configured to receive one of the RF card assemblies along a plane perpendicular to the top surface of the backplane circuit board. The bottom surface includes a plurality of power supply pins configured to engage the electric power rail and the ground path rail. The chassis is configured to enclose the backplane circuit board, the RF card assemblies, and the connectors. The chassis is further configured with a chassis mounting platform to secure the chassis to the platform.

In a further aspect, the inventive concepts disclosed herein are directed to a method of manufacturing an antenna assembly for attachment to a vehicle platform. The method includes providing connectors arranged in rows along a top surface of a backplane circuit board, and sliding the RF card assemblies into slots on side walls of a chassis configured to enclose the backplane circuit board. The method also includes connecting the RF card assemblies to the connectors. Each of the RF card assemblies includes a circuit board having a number of antenna elements, and each of the connectors has a bottom surface configured to engage a top surface of the backplane circuit board. Each of the connectors has an inlet configured to receive one of the RF card assemblies along a plane perpendicular to the top surface of the backplane circuit board, and the bottom surface includes a plurality of power supply pins configured to engage the electric power rail and the ground path rail.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Figure 1:
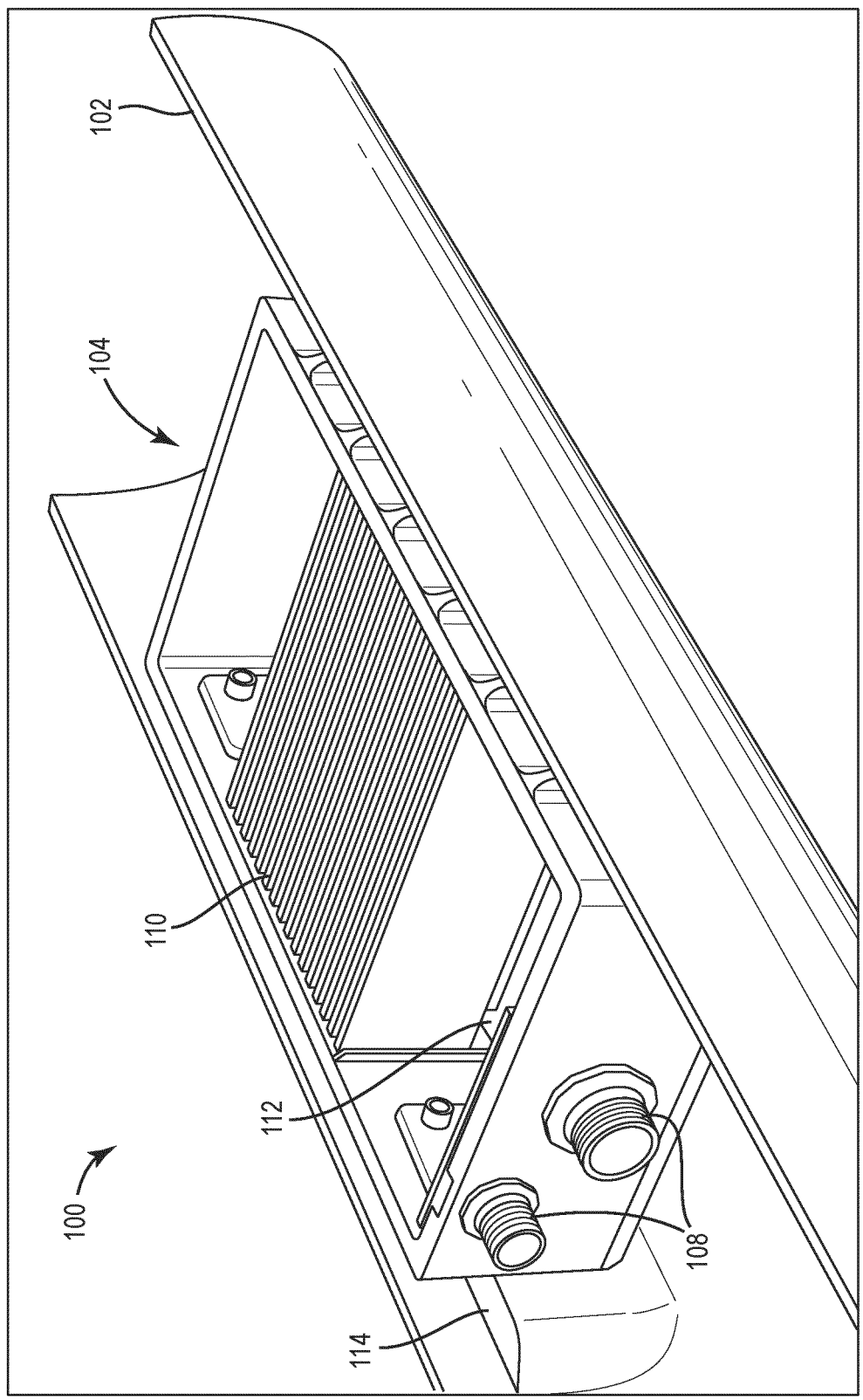
FIG. 1 is a perspective view schematic drawing showing a front of an assembly for an antenna array assembly disposed on a platform, according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein, a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

As used herein, any reference to "one embodiment" or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination or sub-combination of two or more such features, along with any other features which may not necessarily be expressly described or inherently present in the instant disclosure.

Referring generally to the figures, an antenna system is shown and described that may be used in radar, sensor and communications systems. The antenna system can be a planar surface or curved surface antenna array. In some embodiments, the systems and methods described can be utilized in communication, sensing and/or radar systems, such as, military radar systems or weather radar systems, electronic intelligence (ELINT) receivers, electronic counter measure (ECM) systems, electronic support measure (ESM) systems, targeting systems or other systems. In some embodiments, the systems and methods described can be utilized in electronic attack (EA) systems, such as stand in, stand off, and surgical jamming applications. In some embodiments, the systems and methods are utilized to provide an ultra-wide band (UWB) system, such as balanced antipodal Vivaldi antenna (BAVA), Vivaldi, tightly-coupled dipole array, spiral, and the like. The antenna arrays can include but are not limited to phased-array antenna systems, electronically scanned array antenna systems, or electronically scanned array (ESA) antenna systems, such as active electronically-scanned array (AESA) antenna systems, which may include low profile ultra-ultra-wide band (U2WB) technology.

The inventive concepts disclosed herein can be utilized in a number of systems for various types of applications. While the present disclosure describes systems and methods implementable in an aircraft, the inventive concepts disclosed herein may be used in any type of environment (e.g., in another aircraft, a spacecraft, a ground-based vehicle, drone, a simulator, or in a vehicle or non-vehicle application such as a ground-based display system, an air traffic control system, a radar system, a drone control system, or a virtual display system).

Figure 2:
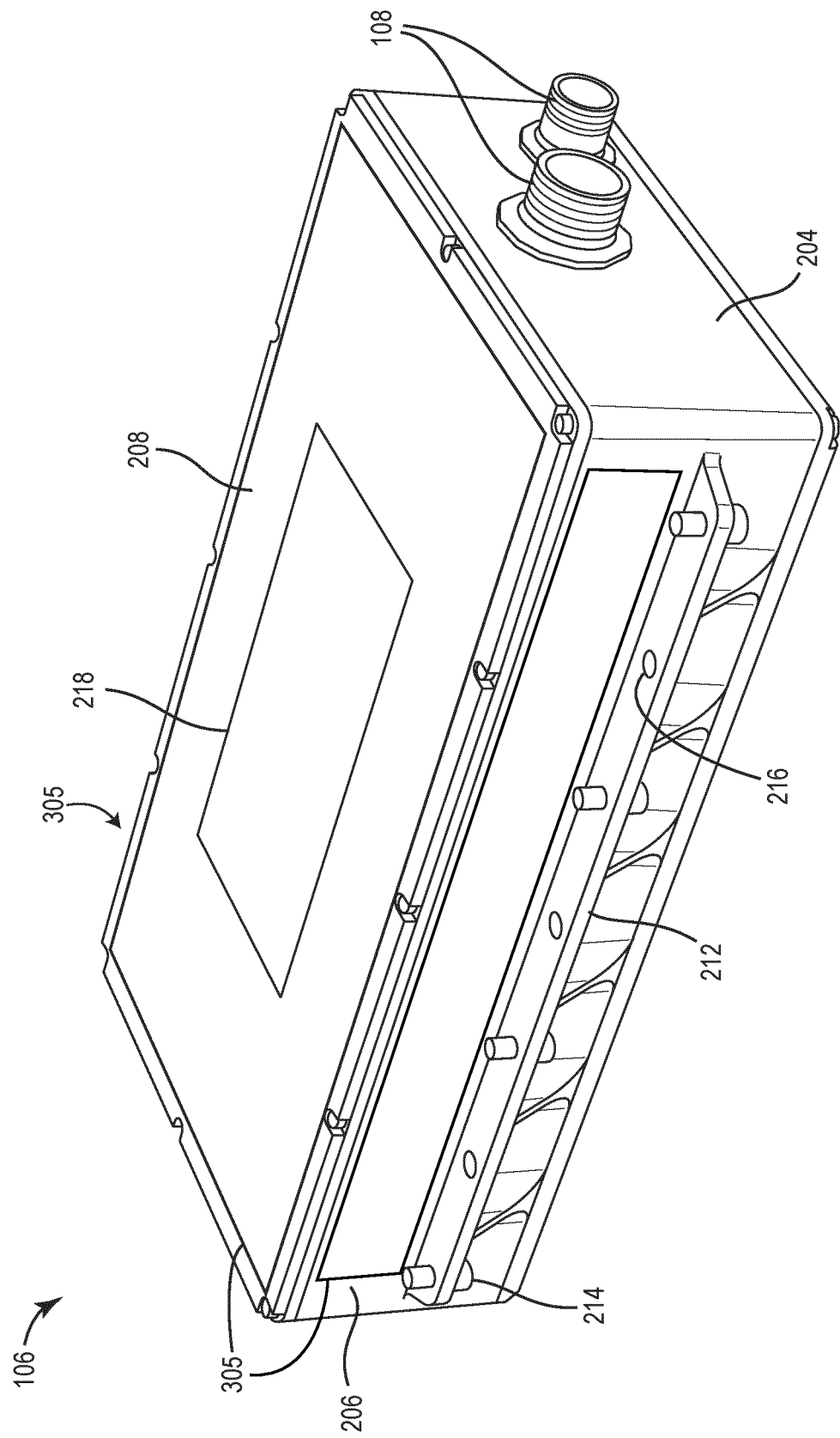
FIG. 2 is a perspective view schematic drawing showing a bottom of the antenna array assembly illustrated in FIG. 1, according to the inventive concepts disclosed herein.
Figure 3:
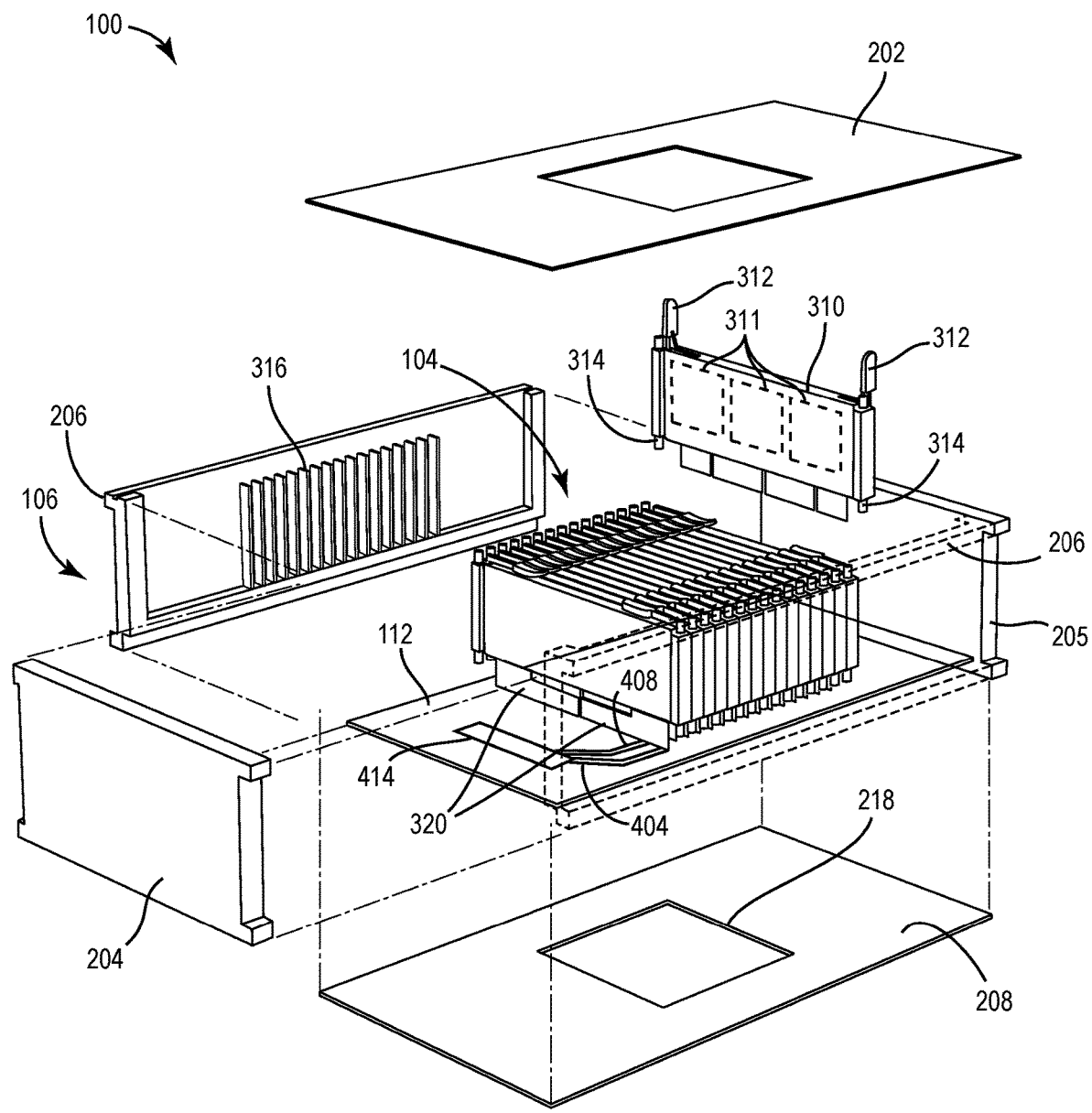
FIG. 3 is an exploded perspective view schematic drawing of the antenna array assembly illustrated in FIG. 1, according to the inventive concepts disclosed herein.

Referring to FIGS. 1, 2, and 3 an antenna system 100 is shown according to some inventive concepts disclosed herein. The antenna system 100 is shown to include an antenna array assembly 104 in FIG. 1. In some embodiments, the antenna array assembly 104 is generally configured as a modular system that facilitates insertion and removal of RF card assemblies 110. In this regard, the antenna array assembly 104 allows for quicker and more convenient repair, maintenance, and/or troubleshooting. In some embodiments, the antenna array assembly 104 is configured with thermal management features as described herein. The antenna array assembly 104 may be aperture agnostic, and the beam former and thermal management features may be configured for any suitable implementation as described herein.

The antenna array assembly 104 is shown to include a chassis 106, a plurality of fittings 108, a number of RF card assemblies 110, and a backplane circuit board 112. In some embodiments, the antenna array assembly 104 is configured to provide an interface to a transceiver (not shown). The antenna array assembly 104 can be part of a sensing system, radar system, and communication system in one embodiment. In some embodiments, the antenna array assembly 104 can be part of an electronic intelligence (ELINT) receiver, an electronic countermeasure (ECM) system, an electronic support measure (ESM) system, and/or hybrids thereof. The antenna array assembly 104 can be realized using parallel radio frequency integrated circuit subcircuits within the radio frequency integrated circuit in one embodiment. In some embodiments, the antenna array assembly 104 is configured to provide paths for signals between the transceiver and a number of antenna elements. In this regard, the antenna array assembly 104 provides appropriate combining, splitting, amplification, phase adjustment, and time delays for the signals associated with the antenna elements. The antenna array assembly 104 can simultaneously operate at more than one channel (e.g., a four-channel system) in some embodiments.

The chassis is formed by a top plate 202, a front plate 204, a rear plate 205, side plates 206, and a bottom plate 208. The top plate 202, the front plate 204, the rear plate 205, the side plates 206, and the bottom plate 208 define a cavity that encapsulates the RF card assemblies 110, the backplane circuit board 112, and other components of the antenna array assembly 104 as described herein. Each of the top plate 202, the front plate 204, the rear plate 205, the side plates 206, and the bottom plate 208 may have any suitable size and thickness. Each of the top plate 202, the front plate 204, the rear plate 205, the side plates 206, and the bottom plate 208 may be constructed from any suitable material, including, but not limited to, plastic, composites, metal, metal alloys, and/or any combination thereof. The top plate 202, the front plate 204, the rear plate 205, the side plates 206, and/or the bottom plate 208 may be secured by fasteners 220 (e.g., screws, nuts, bolts) or any other suitable manner (e.g., welding, adhesive, snap-fit).

The chassis 106 and/or other portions of the antenna array assembly 104 are configured to secure the chassis 106 and/or other portions of the antenna array assembly 104 to a structure. Referring to FIG. 2, the chassis 106 is shown to include a chassis mounting platform 212. The chassis mounting platform 212 can be configured to allow the chassis 106 to be secured to any suitable structure. For example, the chassis mounting platform 212 may be secured to the platform mounting 114 of the platform 102 as described herein. In this regard, the chassis mounting platform 212 may include a number of fasteners 214 (e.g., screws, bolts, and/or nuts) and/or a number of openings 216 to receive fasteners. The openings may be threaded or unthreaded openings configured to receive screws, bolts and/or nuts. In some embodiments, the chassis mounting platform 212, the fasteners 214, and/or the openings 216 are not provided.

The platform 102 may be constructed from any suitable material, including, but not limited to, plastic, composites, metal, metal alloys, and/or any combination thereof. In some embodiments, the platform 102 is configured to facilitate air-cooling of the antenna array assembly 104. In one example embodiment, the platform 102 may correspond to a pod provided on or within an aircraft (e.g., under a wing of the aircraft). The pod may have vents allowing a flow of air to enter and exit the pod. The flow of air may travel around external surfaces of the chassis 106, transferring heat away from the antenna array assembly 104. In some embodiments, the platform 102 may correspond to any suitable structure of an aircraft, a vehicle or any other structure configured to receive the antenna array assembly 104.

As described above, the platform 102 includes a platform mounting 114, which may be configured to facilitate securing the chassis 106 and/or other portions of the antenna array assembly 104 to the platform 102. In some embodiments, the platform mounting 114 may include fasteners and/or openings for engaging the platform mounting 114 to the chassis mounting platform 212. In this regard, the chassis 106 of the antenna array assembly 104 may be secured to the platform 102 (not shown). In some embodiments, the platform 102 and/or the platform mounting 114 is not provided.

The antenna array assembly 104 may be configured with a thermal management device in some embodiments. The antenna array assembly 104 may include any suitable thermal management device configured to actively and/or passively transfer heat away from the antenna array assembly 104. The antenna array assembly 104 may be disposed internally and/or externally to the chassis 106. For example, in some embodiments, the antenna array assembly 104 includes one or more cold-plates 305 (e.g., a liquid-cooled cold plate) which may be secured to external surfaces of the top plate 202, the side plates 206, and/or any other portion of the chassis 106. In some embodiments, the antenna array assembly 104 includes a number of heat sinks, each disposed over a single RF card assembly 110 and/or circuit board 310. The heat sinks may be coupled to a heat pipe configured within and/or around the chassis 106, to transfer away heat generated by the antenna array assembly 104. The antenna array assembly 104 may include any suitable configuration of cold plates, heat sinks, and/or any other suitable thermal management system or device.

The front plate of the chassis 106 is shown to a number of fittings 108, which may be configured to receive electrical conductors or wiring. In some embodiments, the fittings 108 are configured to be secured to conduit. For example, the fittings 108 may include threads on one or more surfaces of the fittings 108 allowing the conduit to be secured to the fittings. The fittings 108 may be configured according to any suitable type and size, and any number of fittings 108 may be provided. In some embodiments, the fittings 108 are additionally or alternatively provided with the top plate 202, the rear plate 205, the side plates 206, and/or the bottom plate 208.

The antenna array assembly 104 may be configured with a number of RF card assemblies 110. Each of the RF card assemblies 110 may include a circuit board 310 (e.g., a printed circuit board or printed wiring board) having a single layer or multiple layers. The circuit board 310 of the RF card assemblies 110 may include an insulating medium (e.g., FR4 glass epoxy, ceramics, FR5 glass epoxy, polyimide, Teflon, etc.) and conductive (e.g., copper) traces in some embodiments. In some embodiments, the circuit board 310 includes a thermally conductive medium, such as copper, to propagate heat. In some embodiments, a heatsink is disposed on one or more of the RF card assemblies 110 (e.g., the circuit board 310) as described herein. It should be understood that the antenna array assembly 104 may be configured for any suitable radio frequency circuit and beam former circuitry.

Each circuit board 310 may be configured to include one or more antenna elements 311 in some embodiments. The antenna elements 311 may be any type of radiating element or dipole for receiving or transmitting radio frequency signals, and may be patterned (or otherwise configured) and can be positioned for a particular polarization. In some embodiments, the antenna elements 311 are conductive components or printed circuit board patterned elements and can be provided on a single side or each side of the circuit boards. In some embodiments, one or more of the combining, splitting, amplification, phase adjustment, and time delay operations is performed utilizing active combiners/splitters associated with a radio frequency integrated circuit (RFIC). In some embodiments, the radiating elements may be embedded into the RF card assembly 110.

Each circuit board 310 may be configured to include radio frequency circuits for the antenna system 100. The radio frequency circuits can be a silicon germanium, gallium arsenide, indium phosphate, or a complementary metal oxide semiconductor integrated circuit configured for radio frequency operation. The radio frequency circuits include the antenna elements, up and down converters and beam former circuitry in some embodiments. The beam former circuitry is digital or analog in nature with amplitude and time delay (or phase shift) adjustment circuitry in some embodiments. In some embodiments, the beam former circuitry can utilize digital beam forming (DBF) circuits where either direct digital I/Q sampling (e.g., pure DBF) RF down conversion occurs immediately behind each radiating element (hybrid DBF) and radiation beams are formed through DBF techniques. In some embodiments, the beam former circuitry includes arrays of phase shifters and variable gain amplifiers for effecting DBF. It should be understood that the circuit board 310 may be configured with any suitable radio frequency circuit and beam former circuitry.

Each of the RF card assemblies 110 is disposed on the backplane circuit board 112 in a direction perpendicular to an upper surface of the backplane circuit board 112 as shown in FIG. 3. In some embodiments, a connector 320 and/or a set of two connectors 320 are disposed on the backplane circuit board 112 and are configured to receive each of the RF card assemblies 110. For example, one of the RF card assemblies 110 may be secured to a connector 320 by friction force. In this regard, the connectors 320 facilitate quick insertion and removal the RF card assemblies 110. Each of the connectors 320 may be disposed to the backplane circuit board 112 via soldering, fasteners, and/or any other suitable manner.

Each of the RF card assemblies 110 may be spaced at any suitable distance relative to each other. In this regard, each of the connectors 320 corresponding to each of the RF card assemblies 110 may be arranged on the backplane circuit board 112 to facilitate a desired spacing between each of the RF card assemblies 110. In some embodiments, the spacing between each of the RF card assemblies 110 is wavelength scaled according to an operating frequency of the antenna system 100. In one example embodiment, the spacing between each of the RF card assemblies 110 may be a value corresponding to a half wavelength of the highest operating frequency. In some embodiments, a distance between each of the RF card assemblies 110 may be a value corresponding to greater than a half wavelength. In some embodiments, one or both of the side plates 206 are configured with a number of channels 316 as shown in FIG. 3. Each of the channels 316 can be sized to receive a side portion of one of the RF card assemblies 110. The RF card assemblies 110, the backplane circuit board 112, and the connectors 320 are described in further detail with reference to FIGS. 4-6.

Figure 4:
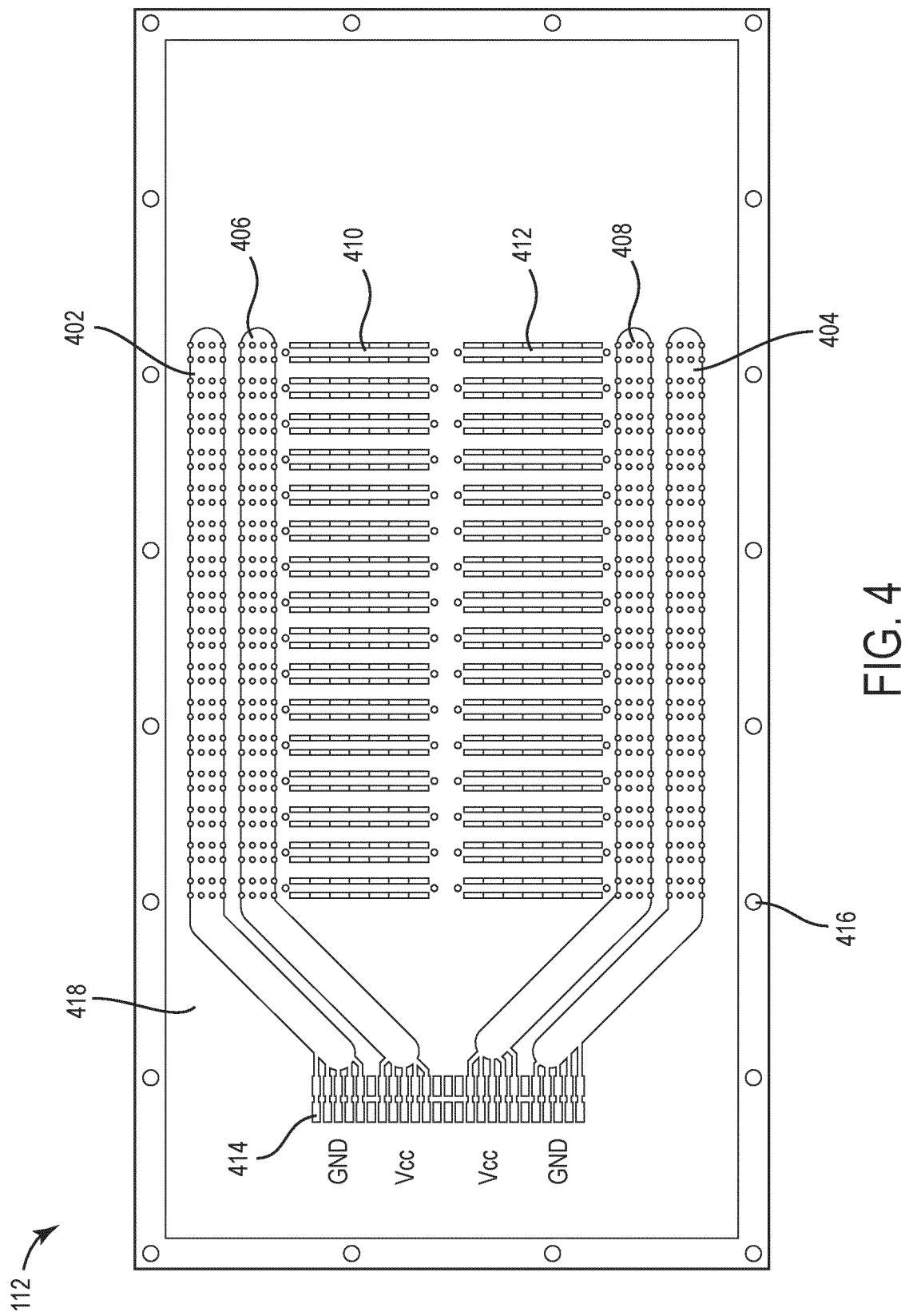
FIG. 4 is a top planar view schematic drawing of a backplane card for the antenna array assembly illustrated in FIG. 1, according to the inventive concepts disclosed herein.

Referring to FIG. 4, a top planar view of the backplane circuit board 112 is shown according to some inventive concepts disclosed herein. The backplane circuit board 112 may include a printed circuit board or printed wiring board 418 having a single layer or multiple layers. The backplane circuit board 112 may include an insulating medium (e.g., FR4 glass epoxy, ceramics, FR5 glass epoxy, polyimide, Teflon, etc.) and conductive (e.g., copper) traces in some embodiments. The backplane circuit board 112 may include a number of openings 416 to facilitate attachment to the chassis 106 via fasteners (not shown). The backplane circuit board 112 may be of any suitable size. In some embodiments, one or more dimensions of the backplane circuit board 112 depends on the number of RF card assemblies 110 provided with the antenna array assembly 104 and/or a spacing between each of the RF card assemblies 110.

The backplane circuit board 112 may include baseband circuits, digital selection circuits, paths and connectors, etc. to facilitate operation of the antenna array assembly 104. In some embodiments, a bottom surface of the backplane circuit board 112 is configured with an aperture (not shown), which is shown in the opening 218 of the bottom plate 208. In some embodiments, the aperture may be configured for linear polarization (vertical, horizontal or some combination), circular or elliptically polarization (including right hand or left hand), and/or 45 degrees slant. In some embodiments, the aperture may be provided as a separate perpendicular structure that connects to the beam former network through elastomeric and/or using one or more connectors. In some embodiments, radio frequency circuits and frequency conversion circuits can be provided on the backplane circuit board 112. The backplane circuit board 112 can be any suitable size and may depend on design parameters in some embodiments. For example, the backplane circuit board 112 may be slightly larger than the aperture in some embodiments.

The backplane circuit board 112 is shown to include first and second ground connection rails 402-404, first and second power connection rails 406-408, first and second RF signal interconnects 410-412, and a power supply source 414. In some embodiments, the first and second power connection rails 406-408 receive a power supply via the power supply source 414. The power supply source 414 may be electrically connected to an external DC power supply and a ground path in some embodiments. In this regard, the power connection rails 406-408 can receive the external DC power for supplying power to each of the RF card assemblies 110, and the ground connection rails 402-404 can provide a ground path for each of the RF card assemblies 110. In some embodiments, the first and second RF signal interconnects 410-412 are configured to provide radio frequency signals to the backplane circuit board 112 as described herein.

In some embodiments, the backplane circuit board 112 is configured to receive each of the connectors 320 in a direction perpendicular to an upper surface of the backplane circuit board 112. The connectors 320 may be disposed to the backplane circuit board 112 via solder, fasteners, and/or any suitable manner. In some embodiments, a set of two of the connectors 320 is configured to receive one of the RF card assemblies 110. For example, a first connector 320 may be electrically connected to the first ground connection rail 402, the first power connection rail 406, and the first RF signal interconnect 410. In this example, a second connector 320 may be electrically connected to the second ground connection rail 404, the second power connection rail 408, and the second RF signal interconnect 412. The first and second connectors 320 may receive one of the RF card assemblies 110 as described herein.

Figure 5:
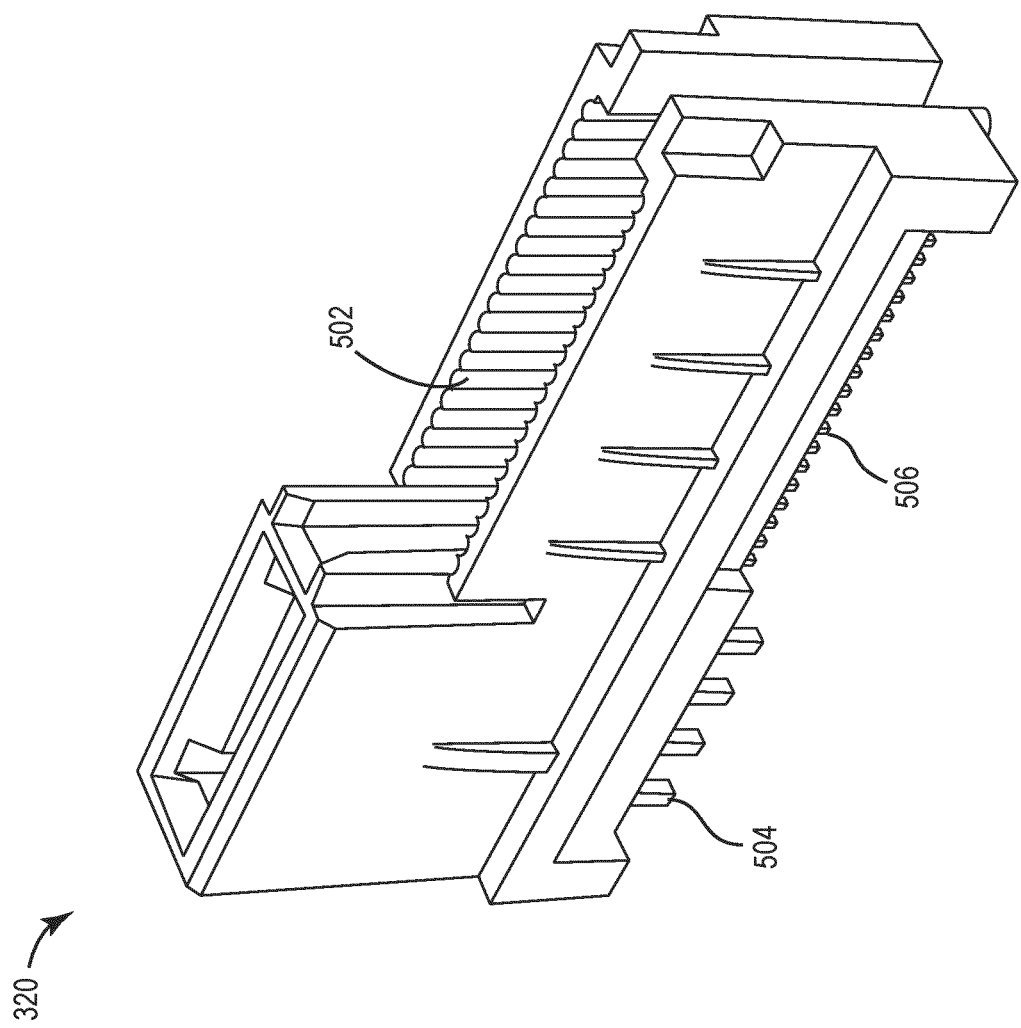
FIG. 5 is a perspective view schematic drawing showing a front of the connector for the antenna array assembly illustrated in FIG. 1, according to the inventive concepts disclosed herein.
Figure 6:
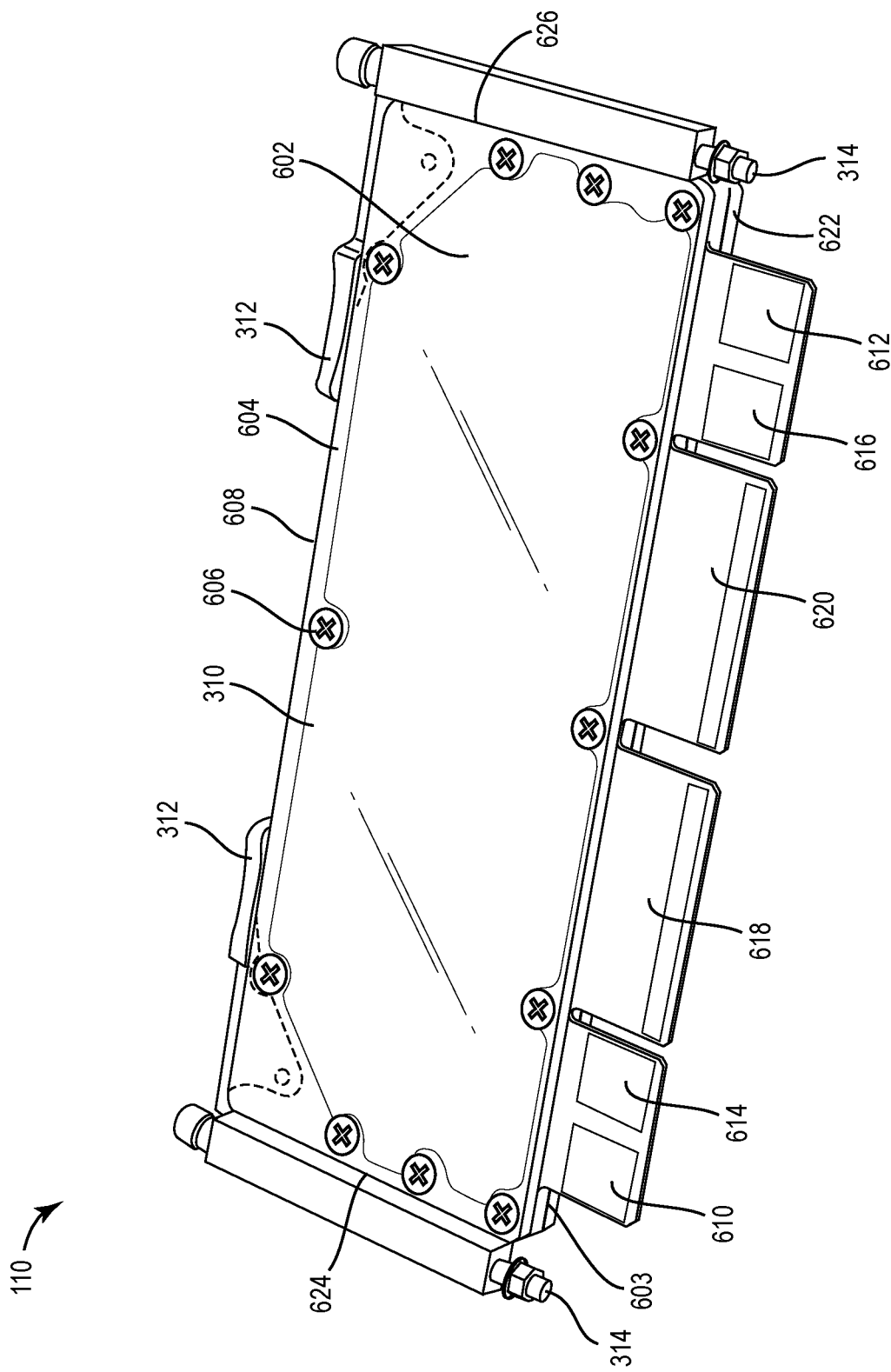
FIG. 6 is a perspective view schematic drawing showing a front of the card assembly for the antenna array assembly illustrated in FIG. 1, according to the inventive concepts disclosed herein.

Referring to FIGS. 5 and 6, the connector 320 and the RF card assembly 110 are shown, respectively, in further detail according to some inventive concepts disclosed herein. The connector 320 is disposed on the backplane circuit board 112 in a direction perpendicular to an upper surface of the backplane circuit board 112 as described herein. The connector 320 is shown to include an inlet 502 for receiving a half of one of the RF card assemblies 110. In other embodiments (not shown), the connector 320 is configured to completely receive one of the RF card assemblies 110. In some embodiments, the connector 320 includes one or more posts 508 for alignment on the backplane circuit board 112.

The connector 320 is shown to include power pins 504 and signal pins 506. In some embodiments, the power pins 504 are configured to provide a power connection and a ground connection from the backplane circuit board 112 to the circuit board 310. In one example embodiment, the power pins 504 include a total of sixteen pins. In this example, eight pins of the power pins 504 may be electrically connected to the first ground connection rail 402 and eight pins of the power pins 504 may be electrically connected to the first power rail 404. The connector 320 is configured to electrically couple the power supply to the tab 614 of the circuit board 310 via conductive paths provided therein. The connector 320 is configured to electrically couple the ground path to the tab 610 via conductive paths provided therein.

The connector is shown to include signal pins 506. Referring to the above example, the signal pins 506 may be electrically connected to or otherwise disposed on the first RF signal interconnect 410. In this regard, the signal pins are configured to pass radio frequency signals between the backplane circuit board 112 and the circuit board 310. The connector 320 is generally configured to couple the radio frequency signals to the tab 618 of the circuit board 310 via conductive paths provided therein.

In some embodiments, a set of two connectors 320 is provided for each of the RF card assemblies 110 as described herein. Referring to the above example, a second connector 320 may be provided and configured to receive the RF card assembly 110 with the first connector 320. The second connector 320 may include power pins 504 having a total of sixteen pins. In this example, eight pins of the power pins 504 may be electrically connected to the second ground rail 404 and eight pins of the power pins 504 may be electrically connected to the second power rail 408. The second connector 320 is configured to electrically couple the power supply to the tab 616 of the circuit board 310 via conductive paths provided therein. The second connector 320 is configured to electrically couple the ground path to the tab 612 via conductive paths provided therein. The second connector 320 is configured to couple radio frequency signals to the tab 620 of the circuit board 310 via conductive paths provided therein. In some embodiments, the set of two connectors 320 described above is provided as a single assembly or device.

In some embodiments, the card assembly 110 is configured to facilitate thermal management features. For example, the circuit board 310 may be configured to include a layer of thermally conductive material 603 to facilitate transferring heat away from the circuit board 310. The thermally conductive material 603 may be any suitable material, including, but not limited to, plastic, composites, metal, metal alloys, and/or any combination thereof. In some embodiments, the layer of thermally conductive material 603 is provided between the front surface 602 and a back surface of the printed circuit board. The layer of thermally conductive material 603 may have any suitable thickness and may be partially or completely provided along a height dimension and a width dimension of the circuit board 310, where the height dimension is defined by the distance between the top surface 608 and the bottom surface 622 of the card assembly 110 and the width dimension is defined by the distance between the opposing sides 624, 626. In one example embodiment, the layer of thermally conductive material 603 is substantially copper and/or graphite having a thickness value between approximately five micro-inches and thirty micro-inches.

In some embodiments, the card assembly 110 is configured to be received by the inlet 502 of the connector 320 and secured to the connector 320 by friction force. In some embodiments, the card assembly 110 additionally includes fasteners 314 (e.g., screws, bolts, nuts) and/or card locks 312, which may be configured to facilitate securing the card assembly 110 and/or the circuit board 310 to the connector 320. The fasteners 314 and/or the card locks 312 may be of any suitable material. In some embodiments, the fasteners 314 and/or the card locks 312 are composed of a metal or metal alloy to facilitate transfer of heat away from the card assembly 110.

In some embodiments, the fasteners 314 may be received by the connector 320 and/or the backplane circuit board 112. The fasteners 314 may provide a compressive force to the top surface 608 of the card assembly 110, engaging the card assembly 110 to the connector 320. In some embodiments, the card locks 312 are configured to secure the circuit board 310 to the card assembly 110 when the card locks 312 are engaged (e.g., when contacting a top surface 608). In some embodiments, the card locks 312 are configured to prevent rotational movement of the fasteners 314 when engaged (e.g., when contacting a top surface 608). When the card locks 312 are disengaged, the fasteners 314 are able to rotate, allowing the circuit board 310 to be disengaged from the connector 320. In some embodiments, the fasteners 314 and/or the card locks 312 are not provided.

In some embodiments, the RF card assembly 110 includes a cover 604 disposed over a front surface 602 of the circuit board 310. The cover 604 may be constructed from any suitable material, such as a thermoplastic material, a metal, and/or a metal alloy. In some embodiments, the cover 604 is secured to the card assembly 110 via a number of fasteners 606, such as screws, nuts, bolts, etc. Any number of fasteners 606 may be provided, and the fasteners 606 may be attached at any suitable location of the front surface 602. In some embodiments, the cover 604 is additionally or alternatively secured to the circuit board 310 and/or portions of the RF card assembly using epoxy, adhesive, or any other suitable manner. In some embodiments, the cover 604 and/or the fasteners 606 are not provided.

In some embodiments, the RF card assembly 110 includes a heat sink. The heat sink may be configured to passively and/or actively transfer heat away from the RF card assembly 110 and/or the circuit board 310. The heat sink may be disposed over a portion of the RF card assembly 110 and/or the circuit board 310 in some embodiments. In this regard, the heat sink may include an inlet configured to engage a top portion of the RF card assembly 110 and/or the circuit board 310. The heat sink may include a number of fins. Each of the fins may be of any suitable size and shape, and a gap between each of the fins may be any suitable distance.

The heat sink may be constructed of a thermally conductive material or metal composition, such as copper or any suitable material including, but not limited to metal, metal alloys, plastics and/or any combination thereof. The heat sink may have any suitable height and width dimensions, which may correspond to one or more dimensions of the RF card assembly 110 and/or the circuit board 310. For example, an inlet of the heat sink may have one size when configured to receive the circuit board 310, and an inlet of the heat sink may have a larger size when configured to receive the RF card assembly 110. In some embodiments, the heat sink is coupled to a heat pipe configured to transfer heat away from a portion of the card assembly 110. In this regard, the heat pipe may be disposed along any suitable portion of the antenna assembly 104. In some embodiments, the heat sink is not provided.

The scope of this disclosure should be determined by the claims, their legal equivalents and the fact that it fully encompasses other embodiments, which may become apparent to those skilled in the art. All structural, electrical and functional equivalents to the elements of the above-described disclosure that are known to those of ordinary skill in the art are expressly incorporated herein by reference and are intended to be encompassed by the present claims. A reference to an element in the singular is not intended to mean one and only one, unless explicitly so stated, but rather it should be construed to mean at least one. No claim element herein is to be construed under the provisions of 35 U.S.C. § 112, sixth paragraph, unless the element is expressly recited using the phrase "means for." Furthermore, no element, component or method step in the present disclosure is intended to be dedicated to the public, regardless of whether the element, component or method step is explicitly recited in the claims.

Embodiments of the inventive concepts disclosed herein have been described with reference to drawings. The drawings illustrate certain details of specific embodiments that implement the systems and methods and programs of the present disclosure. However, describing the embodiments with drawings should not be construed as imposing any limitations that may be present in the drawings. The present disclosure contemplates methods, systems and program products on any machine-readable media for accomplishing its operations. Embodiments of the inventive concepts disclosed herein may be implemented using an existing computer processor, or by a special purpose computer processor incorporated for this or another purpose or by a hardwired system.

Embodiments of the inventive concepts disclosed herein have been described in the general context of method steps which may be implemented in one embodiment by a program product including machine-executable instructions, such as program code, for example in the form of program modules executed by machines in networked environments. Generally, program modules include routines, programs, objects, components, data structures, etc. that perform particular tasks or implement particular abstract data types. Machine-executable instructions, associated data structures, and program modules represent examples of program code for executing steps of the methods disclosed herein. The particular sequence of such executable instructions or associated data structures represent examples of corresponding acts for implementing the functions described in such steps.

It should be noted that although the diagrams herein may show a specific order and composition of method steps, it is understood that the order of these steps may differ from what is depicted. For example, two or more steps may be performed concurrently or with partial concurrence. Also, some method steps that are performed as discrete steps may be combined, steps being performed as a combined step may be separated into discrete steps, the sequence of certain processes may be reversed or otherwise varied, and the nature or number of discrete processes may be altered or varied. The order or sequence of any element or apparatus may be varied or substituted according to alternative embodiments. Accordingly, all such modifications are intended to be included within the scope of the present disclosure.

The foregoing description of embodiments has been presented for purposes of illustration and description. It is not intended to be exhaustive or to limit the subject matter to the precise form disclosed, and modifications and variations are possible in light of the above teachings or may be acquired from practice of the subject matter disclosed herein. The embodiments were chosen and described in order to explain the principals of the disclosed subject matter and its practical application to enable one skilled in the art to utilize the disclosed subject matter in various embodiments and with various modifications as are suited to the particular use contemplated. Other substitutions, modifications, changes and omissions may be made in the design, operating conditions and arrangement of the embodiments without departing from the scope of the presently disclosed subject matter.

What is claimed is:

1. An antenna assembly comprising:
a plurality of RF card assemblies, each of the RF card assemblies comprising an RF circuit board having a number of antenna elements;
a backplane circuit board having a top surface with at least one set of power supply rails, wherein each set of power supply rails includes an electric power rail and a ground path rail, wherein the electric power rail comprises a plurality of first connections configured to supply electric power to the RF card assemblies and the ground path rail comprises a plurality of second connections configured to provide a ground path to the RF card assemblies;
a plurality of connectors arranged in rows along the top surface of the backplane circuit board, each of the connectors having a bottom surface configured to engage the top surface of the backplane circuit board, each of the connectors having an inlet configured to receive one of the RF card assemblies along a plane perpendicular to the top surface of the backplane circuit board, wherein the bottom surface includes a plurality of power supply pins configured to engage the electric power rail and the ground path rail; and
a chassis configured to enclose the backplane circuit board, the RF card assemblies, and the connectors;
wherein the RF card assemblies are each spaced a distance apart, wherein the distance is a value corresponding to at least a half wavelength of a highest operating frequency of the antenna assembly.

2. The antenna assembly of claim 1, further comprising:
a chassis mounting platform, the chassis mounting platform configured to engage a cooling platform configured to transfer heat away from the antenna assembly.

3. The antenna assembly of claim 1, further comprising:
a number of cooling plates configured to transfer heat away from the antenna assembly;
wherein the chassis comprises a top plate, a bottom plate, a front plate, a rear plate, and two side plates, and wherein a cooling plate is disposed on an external surface of at least one of the top plate, the bottom plate, the front plate, the rear plate, and the two side plates.

4. The antenna assembly of claim 3, wherein the antenna assembly comprises three cooling plates, wherein one of the three cooling plates is provided for each of the top plate and the two side plates.

5. The antenna assembly of claim 1, wherein a circuit board of at least one of the RF card assemblies comprises a layer of copper between a top surface and a bottom surface of the RF circuit board.

6. The antenna assembly of claim 5, wherein the layer of copper has a thickness between 29 and 31 micro inches.

7. The antenna assembly of claim 1, wherein the distance between each of the RF card assemblies is a wavelength scaled value according to an operating frequency of the antenna assembly.

8. The antenna assembly of claim 1, wherein at least one of the RF card assemblies comprises a cover disposed over a front surface of the RF circuit board of the RF card assembly and at least one fastener configured to secure the RF card assembly to a corresponding connector.

9. The antenna assembly of claim 1, wherein:
the top surface of the backplane circuit board comprises a first power supply rail provided along a first end of the top surface and a second power supply rail provided along a second end of the top surface and parallel to the first power supply rail, the second end opposing the first end of the top surface; and
each row of connectors includes a first connector and a second connector provided in a direction perpendicular to the power supply rails, wherein power supply pins of the first connector are configured to engage the first power supply rail and power supply pins of the second connector are configured to engage the second power supply rail.

10. The antenna assembly of claim 9, wherein each row of the row of connectors includes one connector configured to engage both the first power supply rail and the second power supply rail.

11. A system of an airborne platform, the system comprising:
an antenna assembly secured to the platform, the antenna assembly comprising:
a plurality of RF card assemblies, each of the RF card assemblies comprising an RF circuit board having a number of antenna elements;
a backplane circuit board having a top surface with at least one set of power supply rails, wherein each set of power supply rails includes an electric power rail and a ground path rail, wherein the electric power rail comprises a plurality of first connections configured to supply electric power to the RF card assemblies and the ground path rail comprises a plurality of second connections configured to provide a ground path to the RF card assemblies;
a plurality of connectors arranged in rows along the top surface of the backplane circuit board, each of the connectors having a bottom surface configured to engage a top surface of the backplane circuit board, each of the connectors having an inlet configured to receive one of the RF card assemblies along a plane perpendicular to the top surface of the backplane circuit board, wherein the bottom surface includes a plurality of power supply pins configured to engage the electric power rail and the ground path rail; and
a chassis configured to enclose the backplane circuit board, the RF card assemblies, and the connectors, wherein the chassis comprises a chassis mounting platform configured to secure the chassis to the platform;
wherein the RF card assemblies are each spaced a distance apart, wherein the distance is a value corresponding to a half wavelength of a highest operating frequency of the antenna assembly.

12. The system of claim 11, wherein the platform is disposed on a wing of the airborne platform, the platform comprising:
a platform mounting configured to engage the chassis mounting platform for securing the antenna assembly to the platform; and
a number of air vents configured to allow an airflow to enter and exit the platform, wherein at least one external surface of the chassis is exposed to the airflow.

13. The system of claim 11, wherein the antenna assembly further comprises:
a number of cooling plates configured to transfer heat away from the antenna assembly;
wherein the chassis comprises a top plate, a bottom plate, a front plate, a rear plate, and two side plates, and wherein a cooling plate is disposed on an external surface of at least one of the top plate, the bottom plate, the front plate, the rear plate, and the two side plates.

14. The system of claim 13, wherein the antenna assembly comprises three cooling plates, wherein one of the three cooling plates is provided for each of the top plate and the two side plates.

15. The system of claim 11, wherein at least one of the RF card assemblies comprises a layer of copper between a top surface and a bottom surface of the RF circuit board.

16. The system of claim 15, wherein the layer of copper has a thickness larger than five micro inches.

17. The system of claim 11, wherein at least one of the RF card assemblies comprises a heat sink configured to transfer heat away from the RF card assembly, the heat sink having an inlet configured to receive a top portion of the RF card assembly.

18. The system of claim 11, wherein at least one of the RF card assemblies comprises a cover disposed over a front surface of the RF circuit board of the RF card assembly and at least one fastener configured to secure the RF card assembly to a corresponding connector.

19. The system of claim 11, wherein:
the top surface of the backplane circuit board comprises a first power supply rail provided along a first end of the top surface and a second power supply rail provided along a second end of the top surface and parallel to the first power supply rail, the second end opposing the first end of the top surface; and
each row of the rows of connectors includes a first connector and a second connector provided in a direction perpendicular to the power supply rails, wherein power supply pins of the first connector are configured to engage the first power supply rail and the power supply pins of the second connector are configured to engage the second power supply rail.

20. A method of manufacturing an antenna assembly for attachment to a vehicle platform, the method comprising:
providing a plurality of connectors arranged in rows along a top surface of a backplane circuit board;
sliding RF card assemblies into channels on side walls of a chassis configured to enclose the backplane circuit board; and
connecting the RF card assemblies to the connectors, each of the RF card assemblies comprising an RF circuit board having a number of antenna elements, each of the connectors having a bottom surface configured to engage the top surface of the backplane circuit board, each of the connectors having an inlet configured to receive one of the RF card assemblies along a plane perpendicular to the top surface of the backplane circuit board;
wherein the RF card assemblies are each spaced a distance apart, wherein the distance is a value corresponding to at least a half wavelength of a highest operating frequency of the antenna assembly.

* * * * *